United States Patent
Ghyselen et al.

(10) Patent No.: US 7,407,867 B2
(45) Date of Patent: Aug. 5, 2008

(54) METHOD FOR CONCURRENTLY PRODUCING AT LEAST A PAIR OF SEMICONDUCTOR STRUCTURES THAT EACH INCLUDE AT LEAST ONE USEFUL LAYER ON A SUBSTRATE

(75) Inventors: Bruno Ghyselen, Seyssinet-Pariset (FR); Cécile Aulnette, Grenoble (FR); Benoît Bataillou, Grenoble (FR); Carlos Mazure, St. Nazaire les Eymes (FR); Hubert Moriceau, Saint Egreve (FR)

(73) Assignees: S.O.I.Tec Silicon on Insulator Technologies, Bernin (FR); Commissariat à l'Energie Atomique (CEA), Paris (FR)

( * ) Notice: Subject to any disclaimer, the term of this patent is extended or adjusted under 35 U.S.C. 154(b) by 139 days.

(21) Appl. No.: 11/509,047

(22) Filed: Aug. 24, 2006

(65) Prior Publication Data

US 2006/0286770 A1 Dec. 21, 2006

Related U.S. Application Data

(63) Continuation of application No. 10/686,084, filed on Oct. 14, 2003, now Pat. No. 7,115,481.

(30) Foreign Application Priority Data

Jun. 6, 2003 (FR) .................................. 03 06845

(51) Int. Cl.
 *H01L 21/20* (2006.01)
(52) U.S. Cl. ...................... 438/455; 438/455; 438/458; 438/459; 438/471; 438/473; 438/475; 257/E21.122
(58) Field of Classification Search ................ 438/455, 438/458–459, 471, 473, 475; 257/E21.122
 See application file for complete search history.

(56) References Cited

U.S. PATENT DOCUMENTS 6,100,166 A 8/2000 Sakaguchi et al. .......... 438/455

(Continued)

FOREIGN PATENT DOCUMENTS

EP 0 867 921 A2 9/1998

(Continued)

OTHER PUBLICATIONS

Tong, Qin-Yi, "Low Temperature Wafer Direct Bonding," Journal of Microelectromechanical Systems, 3(1):29-35 (1994).

*Primary Examiner*—Thanh Van Pham
(74) *Attorney, Agent, or Firm*—Winston & Strawn LLP (57) ABSTRACT

A method for producing a semiconductor structure that includes at least one useful layer on a substrate. This method includes providing a source substrate with a zone of weakness therein that defines a relatively thick useful layer between the zone of weakness and a front face of the source substrate; bonding the front face of the source substrate to a support substrate and detaching the useful layer from the source substrate at the zone of weakness to transfer the useful layer to the support substrate; implanting atomic species into a free face of the useful layer to a controlled mean implantation depth therein to form a zone of weakness within the useful layer that defines front and rear useful layers, with the rear useful layer contacting the source substrate and the front useful layer containing a greater concentration of defects; bonding a stiffening substrate to the free face of the front useful layer after implantation of the atomic species; and detaching the front useful layer from the rear useful layer along the zone of weakness to form a semiconductor structure comprising the support substrate and the rear useful layer thereon. The structures obtained can be used in the fields of electronics, optoelectronics or optics.

14 Claims, 4 Drawing Sheets

U.S. PATENT DOCUMENTS

| | | | |
|---|---|---|---|
| 6,140,210 A * | 10/2000 | Aga et al. | 438/458 |
| 6,150,239 A | 11/2000 | Goesele et al. | 438/458 |
| 6,284,629 B1 * | 9/2001 | Yokokawa et al. | 438/459 |
| 6,403,450 B1 * | 6/2002 | Maleville et al. | 438/471 |
| 6,569,748 B1 | 5/2003 | Sakaguchi et al. | 438/455 |
| 6,613,678 B1 * | 9/2003 | Sakaguchi et al. | 438/695 |
| 2002/0068418 A1 | 6/2002 | Stanley et al. | 438/458 |
| 2002/0089016 A1 | 7/2002 | Joly et al. | 257/349 |
| 2002/0182827 A1 | 12/2002 | Abe et al. | 438/455 |
| 2003/0219959 A1 * | 11/2003 | Ghyselen et al. | 438/458 |
| 2003/0232487 A1 * | 12/2003 | Letertre et al. | 438/459 |
| 2004/0029359 A1 * | 2/2004 | Letertre et al. | 438/458 |

FOREIGN PATENT DOCUMENTS

| | | |
|---|---|---|
| EP | 1 174 926 A1 | 1/2002 |
| FR | 2 797 714 A1 | 2/2001 |
| WO | WO 01/05218 A1 | 3/2001 |

* cited by examiner

US 7,407,867 B2

METHOD FOR CONCURRENTLY PRODUCING AT LEAST A PAIR OF SEMICONDUCTOR STRUCTURES THAT EACH INCLUDE AT LEAST ONE USEFUL LAYER ON A SUBSTRATE

CROSS-REFERENCE TO RELATED APPLICATIONS

This application is a continuation of application Ser. No. 10/686,084 filed Oct. 14, 2003, now U.S. Pat. No. 7,115,481 the entire content of which is expressly incorporated herein by reference.

BACKGROUND ART

This invention generally relates to a method of concurrently producing at least two structures, each having at least one useful layer on a substrate, for applications in the fields of electronics, optoelectronics or optics. In particular, the method includes providing an initial structure that includes a useful layer having a front face on a support substrate, implanting atomic species to form a zone of weakness within the useful layer, bonding a stiffening substrate is bonded to a front face of the initial structure, and detaching a first useful layer from a second useful layer along the zone of weakness to obtain a pair of semiconductor structures. The first structure includes the stiffening substrate and the first useful layer and the second structure includes the support substrate and the second useful layer.

Several layer transfer methods are known. One concerns implanting atomic species under the surface of a source substrate to create a zone of weakness which delimits a thin layer. The next step is to contact the free face of this thin layer with a support substrate, then to detach the thin layer from the remainder of the source substrate and to transfer it to the support substrate. A description of this type of method can be found in the art with reference to the method known under the registered trademark "SMART-CUT®". Use of this method results in generating a source substrate remainder that can be recycled and reused during a future layer transfer. However, this process involves polishing and finishing operations that can be long and costly, due to both the cost of the materials used and the time spent on them. In addition, for some extremely hard materials such as silicon carbide, the aforementioned recycling steps can prove to be very long and difficult.

Another known layer transfer method is called "Bond and Etch Back Silicon on Insulator" ("BESOI"). This technique involves a burning-in method and/or chemical etching treatment via chemical attack used after molecular bonding a source substrate to a support substrate. The free surface (or rear face) of this source substrate is then polished until a thin layer of desire thickness is obtained on the support. It is to be noted that such a method destroys the majority of the source substrate as each structure is made, so this technique is not economically viable, especially when the thin layer material is expensive.

Lastly, Silicon on Insulator ("SOI") type materials include a layer of thick silicon covering a buried layer of silicon dioxide ($SiO_2$) and a transferred superficial layer of silicon, and the same problems concerning recycling exist for the silicon material used to form the transferred layer. In addition to the aforementioned recycling problems, it is difficult to transfer very thin layers, meaning layers that are less than 100 nanometers (100 nm) thick when using the SMART-CUT® type method. Indeed, thin layers transferred in such manner have numerous defects, such as blisters. The defects may be due to, for example, treatments used to strengthen the bonding interface between the thin layer and the support substrate.

The problems concerning transferring very thin good quality layers also exist for SOI substrates. In particular, is noted that the transferred layer of silicon if an SOI structure has defects when less than a certain thickness, for example 20 nm. The defects can increase if a high temperature thermal treatment is also used. In this regard, reference can be made to the article by Q.-Y. Tong, G. Cha, R. Gafiteau and U. Gösele, "Low temperature wafer direct bonding", J. Microelectomech Syst., 3, 29, (1994).

During thermal treatments, for example to strengthen the bonding interface (which is known as "stabilizing") after detachment occurs, a gas is created in the bonding interface. In the case of a thick SOI substrate, the transferred layer is thick and fills the role of a stiffener. In the case of a thin SOI substrate in which the transferred layer and/or the oxide layer are thin, the aforementioned absorption and stiffening phenomena do not take place and use of a gas leads to poor bonding.

In addition, as described in published International Application No. WO 01/115218, implantation of atomic species and detachment of the wafer create defects that are principally concentrated on the inside of the layer to be transferred. It has been observed that the thinner the layer the poorer the quality that results.

SUMMARY OF THE INVENTION

A method for concurrently producing at least a pair of semiconductor structures that each include at least one useful layer on a substrate. The method includes providing an initial structure that includes a useful layer having a front face on a support substrate. Atomic species are implanted into the useful layer to a controlled mean implantation depth to form a zone of weakness within the useful layer that defines first and second useful layers. Next, a stiffening substrate is bonded to the front face of the initial structure. The first useful layer is then detached from the second useful layer along the zone of weakness to obtain a pair of semiconductor structures with a first structure including the stiffening substrate and the first useful layer and a second structure including the support substrate and the second useful layer.

Advantageously, the method includes implanting by introducing atomic species through the front face of the useful layer to form the zone of weakness. In addition, the useful layer is provided at a sufficient thickness to provide multiple first and second useful layers during further processing. In a preferred embodiment, the technique includes repeating the implanting, bonding and detaching steps on the useful layers of the first and second structures to provide a third and fourth semiconductor structures, with the third structure including a second stiffening substrate and a third useful layer, and the fourth structure including a third stiffening substrate and a fourth useful layer. In a variation, the first and second useful layers are provided at sufficient thicknesses to provide multiple third and fourth useful layers during further processing. Such structures are suitable for use in electronic, optoelectronic or optic applications.

An alternative embodiment relates to a method for producing a semiconductor structure that includes at least one useful layer on a substrate. This method includes providing a source substrate with a zone of weakness therein that defines a relatively thick useful layer between the zone of weakness and a front face of the source substrate; bonding the front face of the source substrate to a support substrate and detaching the useful layer from the source substrate at the zone of weakness to transfer the useful layer to the support substrate, wherein the transferred useful layer has a free face provided by the detachment at the zone of weakness; implanting atomic species into the free face of the useful layer to a controlled mean implantation depth therein to form a zone of weakness within the useful layer that defines front and rear useful layers, with the rear useful layer contacting the support substrate and the front useful layer containing a greater concentration of defects; bonding a stiffening substrate to the free face of the front useful layer after implantation of the atomic species; and detaching the front useful layer from the rear useful layer along the zone of weakness to form a semiconductor structure comprising the support substrate and the rear useful layer thereon. The latter embodiment enables the production of a semiconductor structure that has a relatively useful layer having a thickness of 50 nanometers or less and which is relatively free of defects.

In an advantageous implementation, included is at least one intermediate layer in the initial structure between the useful layer and the support substrate. In another variation, an intermediate layer is provided in the second structure between the stiffening substrate and the first useful layer. Such intermediate layers are preferably made of at least one of silicon dioxide ($SiO_2$), silicon nitride ($Si_3N_4$), a high permitivity insulating material, or diamond.

In another advantageous implementation, bonding is achieved by molecular adhesion. In addition, at least one of the support substrate, the stiffening substrate, or the useful layer is made of a semiconductor material. The support substrate and/or the stiffening substrate may include at least one layer made of at least one of silicon, silicon carbide, sapphire, diamond, germanium, quartz, yttrium-stabilized zirconia or an alloy of silicon carbide. In addition, the useful layer may be made of at least one of silicon, silicon carbide, sapphire, diamond, germanium, silicon-germanium, a group III-V compound or a group II-VI compound, and the support substrate may be made of a single-crystal or poly-crystal silicon, the useful layer is made of a single-crystal silicon, and the stiffening substrate is made of a single-crystal or poly-crystal silicon.

The methods according to the invention allow at least one pair of structures to be formed at the end of each cycle using a single source substrate which can then be recycled. The present invention is thus more economical to use and commercially feasible than known methods that recycle the source substrate. Moreover, as the cycles are repeated, an operator can choose to use the same or different types of stiffener substrates, and can also choose to include one or more intermediate or interposed layers. The technique according to the invention is thus flexible, allowing for different possible combinations of concomitantly formed structures that include stacks of different layers.

Furthermore, depending on the parameters used to implant atomic species, it is also possible to create a zone of weakness such that the rear or second useful layers are very thin. For example, such thin layers may be less than 50 nanometers (50 nm) thick, whereas the neighboring front useful layers are much thicker. The thickness of the front useful layer associated with that of the stiffener which is pressed against it allows for a later thermal annealing treatment that will not deform the rear useful layer, and that will not cause blisters to form on the rear useful layer. The result is that a much thinner rear useful layer can be transferred than presently possible using conventional methods. Yet further, it has been found that the implantation of atomic species steps carried out on the substrates of the first rank or higher structures concentrate the defects in the front useful layers. Consequently, the rear useful layers were not directly subjected to the implantation, and thus have defects linked to the implantation and to detachment that extend over a lesser thickness in the detachment zone than that of the front layer.

BRIEF DESCRIPTION OF THE DRAWINGS

Other aspects, purposes and advantages of the invention will become clear after reading the following detailed description with reference to the attached drawings, in which.

DETAILED DESCRIPTION OF THE PREFERRED EMBODIMENTS

Figure 1A:
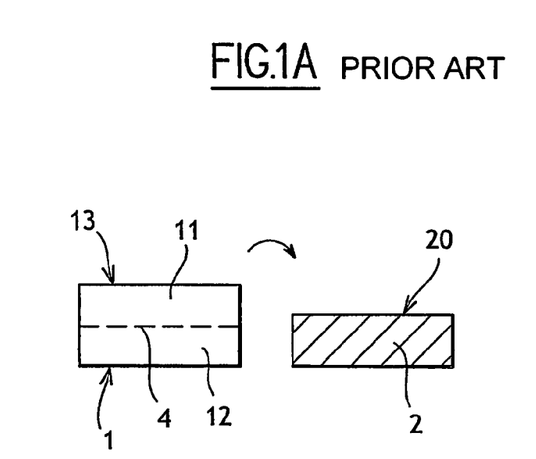
FIGS. 1A to 1C illustrate the different steps of a method of producing a structure comprising a useful layer transferred to a support substrate.

The present method includes forming a first structure 5 or 5' obtained by, for example, using one of the methods whose successive steps are illustrated in FIGS. 1A to 1C or 2A to 2C. These first structures are called rank 1 structures. In particular, FIG. 1A shows a source substrate 1 having a zone of weakness 4 that includes two parts: a useful layer 11 and a remainder layer 12 or rear part of the source substrate. This zone of weakness 4 is the "initial zone of weakness".

The source substrate 1 has a "front face" 13 which will come into contact with a support substrate 2 which will be described later. Advantageously, the source substrate 1 is made of a semiconductor material, in particular those commonly used for applications in the field of electronics, optoelectronics or optics. For example, it could be made of silicon, silicon carbide, sapphire, diamond, germanium, silicon-germanium, III-V compounds or II-VI compounds. III-V compounds are compounds wherein one of the elements appears in column III of the periodic table and the other appears in column V, such as gallium nitride (GaN), gallium arsenide (AsGa) or indium phosphide (InP). II-VI compounds are compounds wherein one of the elements appears in column II of the periodic table and the other appears in column VI, such as cadmium telluride (CdTe). The source substrate 1 can also be a compound substrate, which is a substrate composed of a solid part, for example silicon, having an overlying a buffer layer, for example, of silicon germanium (SiGe).

According to a first alternative embodiment, atomic species could be implanted to obtain the initial zone of weakness 4. The phrase "implantation of atomic species" means any bombardment of atomic, molecular or ionic species, which introduces these species into a material, with a maximum concentration of the species located at a predetermined depth below the bombarded surface 13. Atomic species can be implanted in the source substrate 1 by using, for example, an ion beam implanter or a plasma immersion implanter. Preferably, implantation is carried out by ion bombardment. In addition, the ionic species that is implanted is hydrogen. Other ionic species can be advantageously used alone or in combination with hydrogen, such as rare gases (for example helium). Other variations of implantation techniques could also be used.

The implantation results in creating the initial zone of weakness 4 in the volume of the source substrate 1 at an average depth of penetration of the ions. The zone of weakness 4 extends substantially parallel to the plane of the front face 13. The useful layer 11 extends between the front face 13 and this zone of weakness 4. This step can be carried out by utilizing the method known under the registered trademark "Smart Cut".

The initial zone of weakness 4 can also be comprised of a porous layer that is formed, for example, as described U.S. Pat. No. 6,100,166. In this case, the useful layer 11 may be obtained via epitaxy.

The support substrate 2 acts as a mechanical support and thus generally has a thickness of at least about 300 micrometers. It is preferably made of any single-crystal or polycrystal semiconductor material often used in the aforementioned applications. The support substrate 2 can be a single-layer solid substrate chosen for example from among silicon, silicon carbide, sapphire, diamond, germanium, quartz, yttrium-stabilized zirconia ($ZrO_2(YO_3)$) and an alloy of silicon carbide.

Figure 1B:
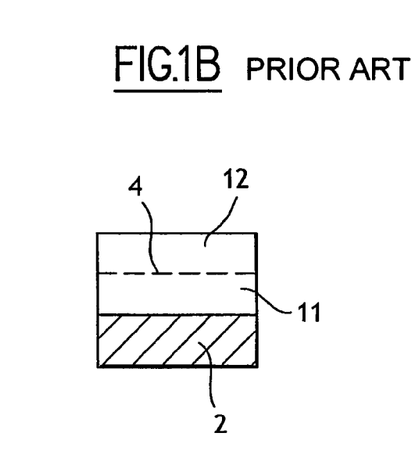

Referring to FIG. 1A, the support substrate 2 has one face 20, termed the "front face" which receives the front face 13 of the source substrate 1. Then, as represented in FIG. 11B, the front face 13 of the useful layer 11 is directly bonded onto the support substrate 2 without an intermediate layer. Advantageously, this bonding is carried out via molecular adhesion. After a possible thermal annealing step, the remainder 12 is detached along the initial zone of weakness 4 by applying stresses (see FIG. 1C). One of the following techniques may be used to detach the remainder: the application of mechanical or electric stresses, chemical etching or the application of energy, for example the use of a laser, of microwaves, of an inductive heater, or a thermal treatment in an oven. These detachment techniques are known to those skilled in the art and will not be described in any further detail, and can be used alone or combined. A first rank structure (rank 1) 5 is thus obtained which includes the useful layer 11 transferred to a support substrate 2.

Figure 1C:
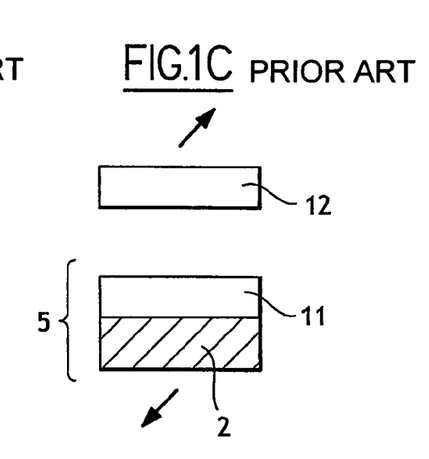
Figure 2A:
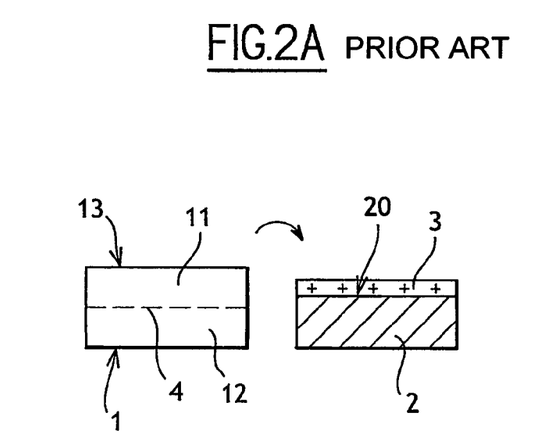
FIGS. 2A to 2C are diagrams illustrating an alternative embodiment of the method represented in FIGS. 1A to 1C according to which a structure is obtained that includes a useful layer transferred to a substrate via an intermediate layer.
Figure 2B:
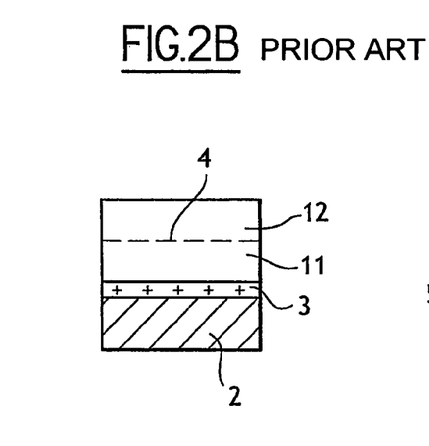
Figure 2C:
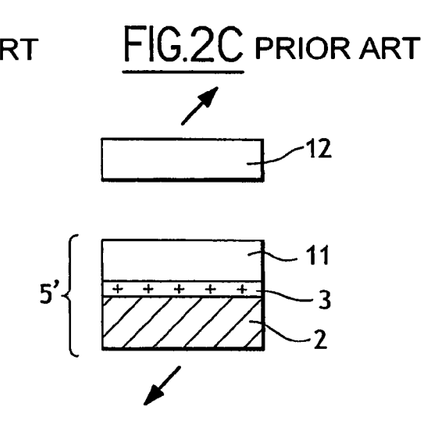

FIGS. 2A to 2C illustrate an alternative embodiment of the method which has been described with regard to FIGS. 1A to 1C. This alternative technique differs in that at least one intermediate layer 3 is inserted between the useful layer 11 and the support substrate 2. For reasons of clarity and simplicity, in FIGS. 2A to 2C and in FIGS. 5A to 5F only one intermediate layer 3 has been represented, but additional intermediate layers could be used. Advantageously, each of these intermediate layers 3 are made of a material chosen from among silicon dioxide ($SiO_2$), silicon nitride ($Si_3N_4$), high permitivity insulating materials, and diamond. It is also possible to have an intermediate layer made of strained silicon on a useful layer of relaxed silicon-germanium (SiGe). In the case where there are several intermediate layers 3, the latter layer or layers can be either of the same nature or of a different nature.

The intermediate layer 3 can be formed via chemical plating techniques in vapor phase or any other technique known to those skilled in the art. Such techniques could be conducted on either the front face 20 of the support substrate 2, on the front face 13 of the source substrate 1, or on the two front faces. Such a technique is conducted prior to applying or bonding these two substrates against one other. When the intermediate layer 3 is an oxide layer, it can also be formed via thermal oxidation of one or the other of the two substrates 1 or 2. Irrespective of how the intermediate layers 3 were formed, the free surface of the upper intermediate layer is bonded to the free surface of the substrate 1 or 2 facing it, preferably via molecular adhesion.

The result of the alternative embodiment of the method is a first rank structure 5' that includes the source substrate 2, the useful layer 11, and the intermediate layer 3 inserted between them. The word "transferred" herein with regard to a first rank structure signifies that a useful layer is transferred to a support substrate via a method comprising at least one bonding step, with or without an intermediate layer 3. According to another embodiment not shown in the figures, the useful layer 11 can be transferred to the support substrate 2 via the BESOI technique, with or without an intermediate layer 3.

Figure 3A:
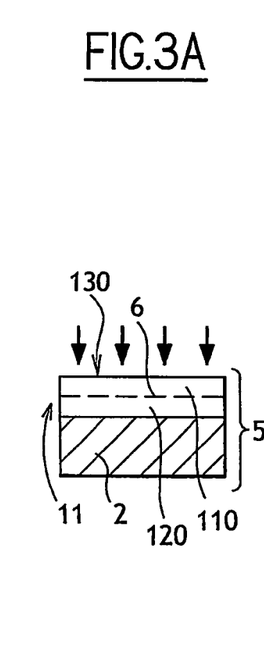
FIGS. 3A to 3F are diagrams illustrating the different steps of a first embodiment of the method of concurrently producing at least a pair of structures according to the invention.
Figure 3B:
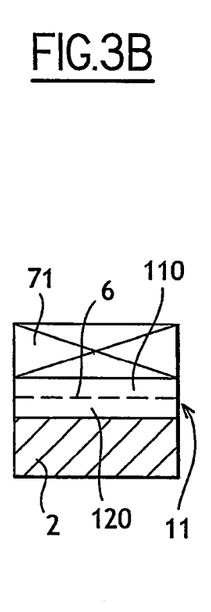
Figure 3C:
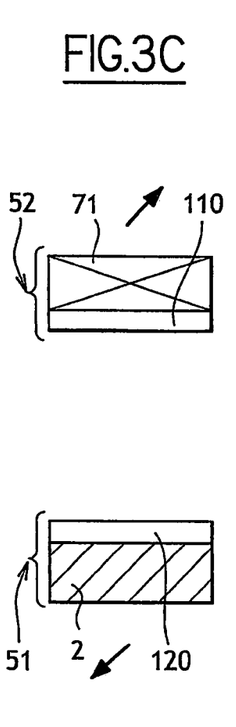

FIGS. 3A to 3C illustrate a complete cycle of steps of a first embodiment of the present method, which results in a pair of structures each comprising a useful layer transferred to a substrate. As shown in FIG. 3A, a zone of weakness 6 is formed on the inside of the useful layer 11 of the previously obtained first rank structure 5, via the implantation of atomic species according to the previously described technique for obtaining a zone of weakness. Two layers are thus defined, namely a first or front useful layer 110 and a second or rear useful layer 120 located between the front useful layer 110 and the support substrate 2.

As shown in FIG. 3B, a stiffening substrate 71 is adhered to the free surface 130 of the front useful layer 110, via bonding, preferably by direct bonding via molecular adhesion. The last step illustrated in FIG. 3C consists of detaching the stacks of layers obtained during the previous step, along said zone of weakness 6. The layers are detached by applying stresses according to techniques known to those skilled in the art, and previously described above with regard to FIGS. 1C and 2C.

Two structures 51 and 52 of a second rank are thus obtained. The first structure 51 comprises the support substrate 2 and the rear useful layer 120 and the second structure 52 comprises the stiffening substrate 71 and the front useful layer 110. It is to be noted that the useful layer 11 must have a sufficient thickness so that, after detachment, the two useful layers 110 and 120 do not have any defects or blisters. The thickness of the two useful layers 110 and 120 can be identical or different according to the depth of implantation of the atomic species and therefore of the localization of the zone of weakness 6. It should also be noted that the useful layer may be of sufficient thickness to permit multiple structures to be formed, which will be explained below.

It is possible to repeat the cycle of operations that has just been described (that is, the creation of a zone of weakness, adhesion of a stiffening substrate, and detachment along the zone of weakness) with at least one of the structures 51, 52 of the second rank, or to both of them. Consequently, one or two pairs of third rank structures 511, 512, 521, 522 (see FIG. 3F) are obtained.

Figure 3D:
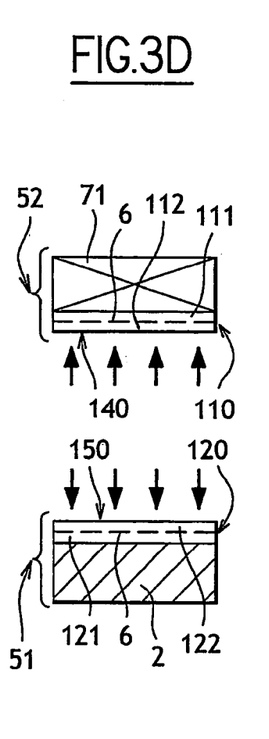
Figure 3E:
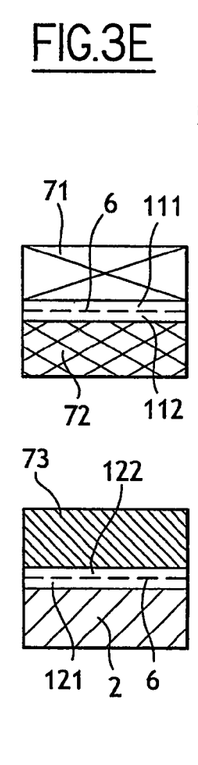
Figure 3F:
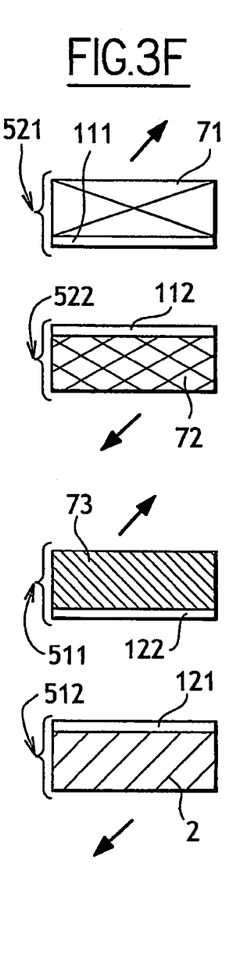

As illustrated in FIG. 3D, the front face 140 of the useful layer 110 is subjected to implantation of atomic species to create a zone of weakness 6, to define a rear useful layer 111 and a front useful layer 112. A similar method is used to continue processing with the second rank structure 51, to obtain a front useful layer 122 and a rear useful layer 121. The next step is to adhere or bond, via molecular adhesion, a stiffening substrate 72 to the front face 140 of the front useful layer 112 and a stiffening substrate 73 to the front face 150 of the rear useful layer 122. As shown in FIG. 3F, the next step is to detach the two stacks of layers along the zone of weakness 6 so as to obtain four third rank structures.

The two third rank structures 521 and 522 issue from the second rank structure 52 through use of a stiffener 71 and the rear useful layer 111 for the first one, and the use of stiffener 72 and the front useful layer 122 for the second one. The two third rank structures 511 and 512 issue from the second rank structure 51 and include the stiffener 73 and the front useful layer 122 for the first one, and the support substrate 2 and the rear useful layer 121 for the second one.

It is then possible to repeat, if desired, the cycle of the three operations that has just been described. The starting structure could be at least one of the rank three structures or of following ranks. The cycle should end when the useful layers transferred onto a substrate reach a thickness above which an extra cycle would result in the transfer of a poor quality useful layer, meaning one having defects or blisters.

FIGS. 4A to 4F illustrate an alternative embodiment of the present method. This method is different from that described with reference to FIGS. 3A to 3F in that at least one interposed layer 8 and/or 8", is inserted between the stiffening substrates 71 and 73, respectively and the useful layer that faces it. It should be noted that the figures show only a single interposed layer 8, 8" for the purposes of simplification, but more such layers could be used.

The interposed layer 8 or 8" can be made, for example, via chemical plating in a vapor phase or by any other layer plating technique known to those skilled in the art. The interposed layers 8 or 8", respectively, can also be obtained via oxidation of the stiffening substrate 71 or 73, respectively. This plating can be carried out either on the stiffener prior to its application onto the useful layer, or onto the latter, preferably prior to implanting atomic species to create the zone of weakness 6. The interposed layer 8 or 8" is then bonded to the layer facing it, preferably by molecular adhesion. For example, the interposed layers 8, 8" are made in a chosen material from among silicon dioxide ($SiO_2$), silicon nitride ($Si_3N_4$), high permitivity insulating materials, and diamond. In the case where there are several interposed layers 8, 8", these can be of the same nature or of different natures.

Figure 4A:
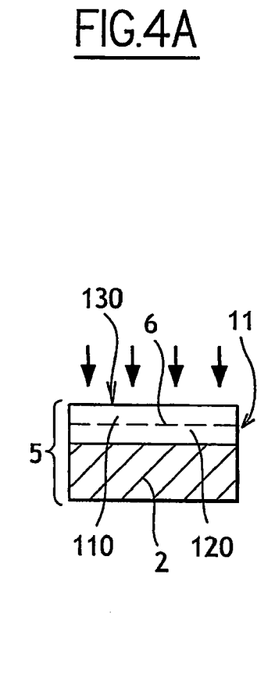
FIGS. 4A to 4F are diagrams illustrating an alternative embodiment according to the invention of the method represented in FIGS. 3A to 3F.
Figure 4B:
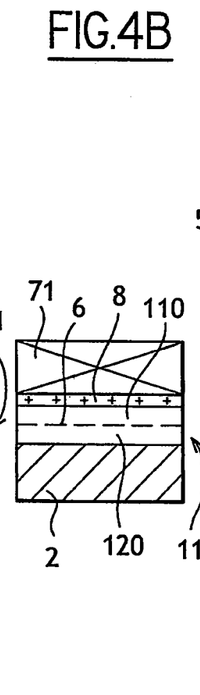
Figure 4C:
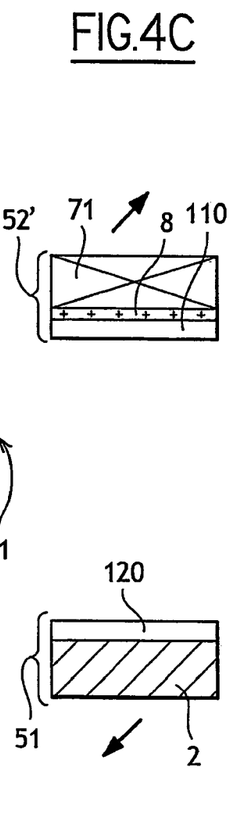
Figure 4D:
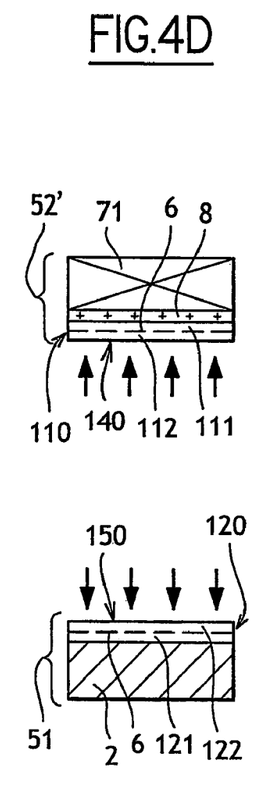
Figure 4E:
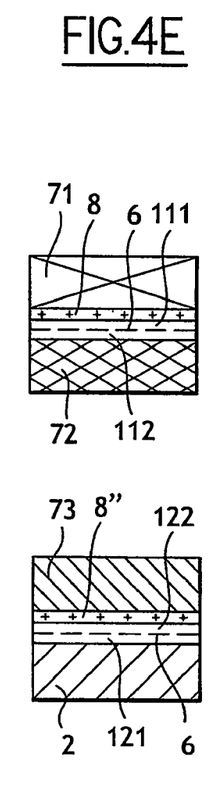
Figure 4F:
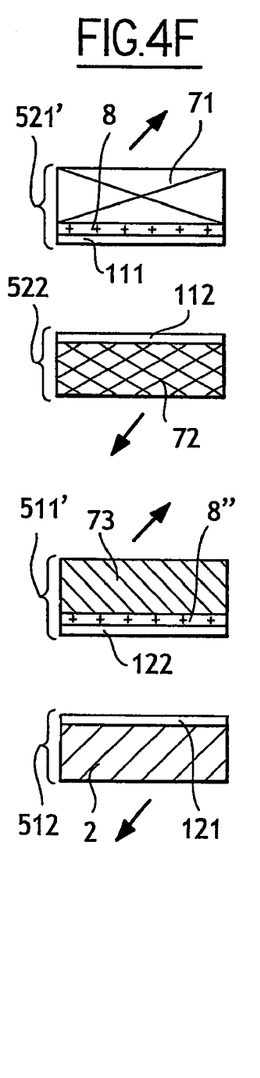

FIG. 4E shows that the stiffener 72 is directly bonded onto the front useful layer 112, meaning that it is bonded without an interposed layer. Four third rank structures are thus obtained, of which only two, reference numbers 521' and 511', comprise a stiffener, a useful layer and an interposed layer.

FIGS. 5A to 5F show a second embodiment of the present method. This method is different from the first embodiment of FIGS. 4A to 4F in that the starting structure used is the first rank structure 5', comprising an intermediate layer 3 inserted between the useful layer 11 and the support substrate 2. In addition, an interposed layer 8' is used between the stiffener 72 and the front useful layer 112. This interposed layer 8' is of the same nature and is obtained in the same way as the previously described interposed layers 8 or 8".

Figure 5A:
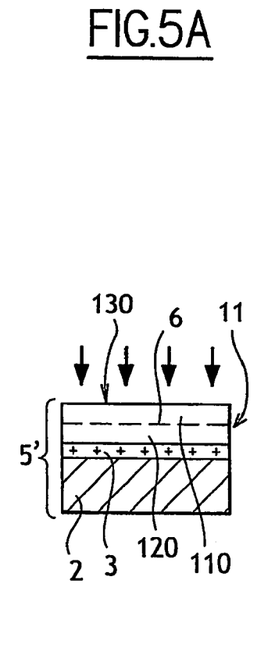
FIGS. 5A to 5F are diagrams illustrating the different steps of a second embodiment of the method according to the invention.
Figure 5B:
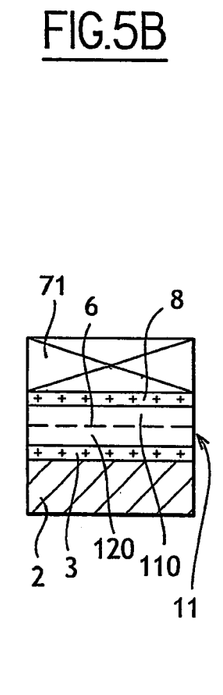
Figure 5C:
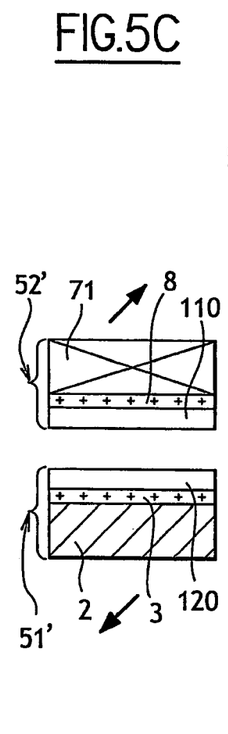
Figure 5D:
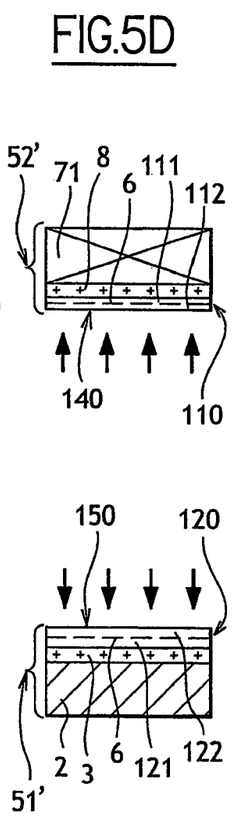
Figure 5E:
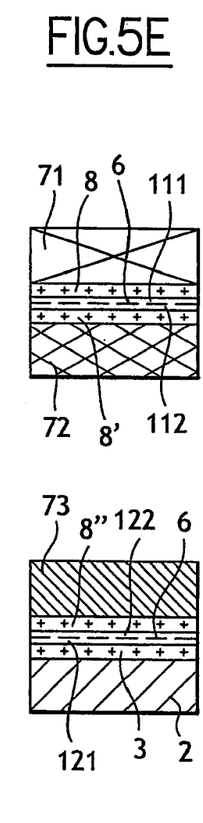
Figure 5F:
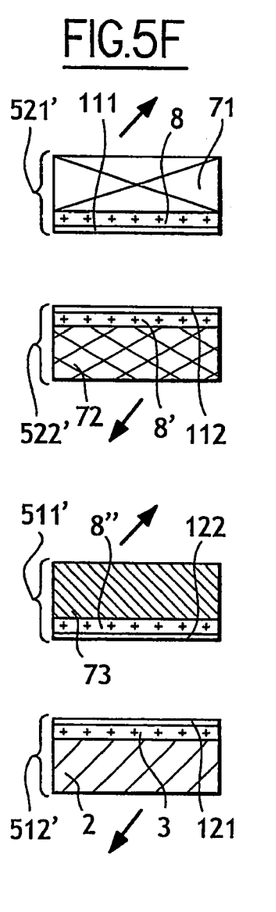

Two second rank structures 51' and 52', and then four third rank structures 521', 522', 511' and 512' are obtained. Each of the third rank structures 521'm 52' and 511' include a stiffener, an interposed layer 8, 8' or 8" and a useful layer. The fourth structure 512' includes the support substrate 2, the intermediate layer 3 and the useful layer 121.

The expression "adhere a stiffening substrate onto a useful layer" herein encompasses the case where there is close contact between the stiffener and the useful layer, and the case where at least one interposed layer 8, 8' or 8" is present between them. In the different methods which have just been described, the expression "stiffening substrate" refers to any type of substrate that acts as a mechanical support and allows for the detachment of the useful layer from the substrate from which it issues.

The choice of the type and/or material (nature) of the stiffener 71, 72, 73 depends on the final targeted application for the structure. The stiffening substrates 71, 72, 73 can be chosen from among the examples given for the support substrate 2.

The different alternative methods which have just been described allow at least one pair of structures to be formed at the end of each cycle for a single source substrate 1 which can then be recycled. The present methods are thus more economical and commercially feasible than the known methods which require recycling of the source substrate after each structure is created.

Moreover, upon each cycle repetition, an operator can choose to apply the same type or different stiffeners and can leave out all or include at least one of interposed layer 8, 8' or 8". The methods are thus flexible, because there is the possibility of concomitantly forming the structures comprising stacks of different layers.

Finally, depending on the parameters used to implant atomic species, it is also possible to create a zone of weakness 6 so that the rear useful layers 120, 111 or 121 are very thin. For example, such thin layers may be less than 50 nanometers (50 nm) thick, whereas the neighboring front useful layers 110, 112 or 122 may be much thicker. The thickness of the front useful layer associated with that of the stiffener which is pressed against it allows for a later thermal annealing treatment that will not deform the rear useful layer, and that will not cause blisters to form on the rear useful layer. The result is that a much thinner rear useful layer can be transferred than presently possible using conventional methods such as the SMART-CUT® method.

Additionally, the implantation of atomic species steps carried out on the substrates of the first rank or higher structures concentrate the defects in the front useful layers 110 or 122. The rear useful layers 120 or 121 were not directly subjected to the implantation and thus have a zone with defects linked to the implantation and to the detachment extending over a lesser thickness in the detachment zone than that of the front layer.

The following is a description of an example of the present method with reference to FIGS. 5A to 5F.

EXAMPLE 1

The first rank structure used here is a SOI substrate type structure 5' that includes a support substrate 2 of single-crystal silicon, an intermediate layer 3 of silicon dioxide $SiO_2$ having a thickness of 20 nm, and a useful layer 11 of single-crystal silicon having a thickness of 1.5 µm. A zone of weakness 6 is created by implanting hydrogen ions based on an implantation energy of about 150 keV and an implantation dose of about $6.10^{16} H^+/cm^2$. A rear useful layer 120 is thus created having a thickness of 20 nm. A single-crystal silicon stiffener 71 having an interposed layer 8 of silicon dioxide $SiO_2$ of a thickness of 20 nm is then applied. The two structures are then detached along the zone of weakness 6 to simultaneously obtain a pair of SOI substrates 51' and 52'. The cycle of the operations is then repeated using the second rank SOI substrate 52' as a starting structure.

Once the surfaces have been prepared, the front useful layer 112 has a thickness of about 0.6 microns and the rear useful layer 111 has a thickness of about 0.6 microns. When a single-crystal silicon stiffener 72 covered in a layer of silicon dioxide 8' of a thickness of 20 nm (20 nanometers) is used, two third rank SOI substrates 521' and 522' are obtained after detachment that have respective useful layers 111 and 112 that are about 0.6 microns thick.

What is claimed is:

1. A method for producing a semiconductor structure that includes at least one useful layer on a substrate comprising:
   providing a source substrate with a zone of weakness therein that defines a useful layer between the zone of weakness and a front face of the source substrate;
   bonding the front face of the source substrate to a support substrate and detaching the useful layer from the source substrate at the zone of weakness to transfer the useful layer to the support substrate, wherein the transferred useful layer has a free face provided by the detachment at the zone of weakness;
   implanting atomic species into the free face of the useful layer to a controlled mean implantation depth therein to form a zone of weakness within the useful layer that defines front and rear useful layers, with the rear useful layer contacting the support substrate and the front useful layer containing a greater concentration of defects;
   bonding a stiffening substrate to the free face of the front useful layer after implantation of the atomic species; and
   detaching the front useful layer from the rear useful layer along the zone of weakness to form a semiconductor structure comprising the support substrate and the rear useful layer thereon.

2. The method of claim 1, wherein the rear useful layer has a thickness of 50 nanometers or less.

3. The method of claim 1, wherein the zone of weakness in the source substrate is provided by implanting atomic species or by a porous layer.

4. The method of claim 1, which further comprises providing at least one intermediate layer between the useful layer and the support substrate prior to bonding.

5. The method of claim 4, wherein the intermediate layer is at least one of silicon dioxide (SiO2), silicon nitride (Si3N4), a high permitivity insulating material, or diamond.

6. The method of claim 1, which further comprises providing at least one intermediate layer between the stiffening substrate and the useful layer.

7. The method of claim 6, wherein the intermediate layer is at least one of silicon dioxide (SiO2), silicon nitride (Si3N4), a high permitivity insulating material, or diamond.

8. The method of claim 1, wherein the bonding is achieved by molecular adhesion.

9. The method of claim 1, wherein at least one of the support substrate, the stiffening substrate, or the useful layer is made of a semiconductor material.

10. The method of claim 1, wherein the useful layer is made of at least one of silicon, silicon carbide, sapphire, diamond, germanium, silicon-germanium, a group III-V compound or a group II-VI compound.

11. The method of claim 1, wherein the stiffening substrate is or includes at least one layer made of at least one of silicon, silicon carbide, sapphire, diamond, germanium, quartz, yttrium-stabilized zirconia or an alloy of silicon carbide.

12. The method of claim 1, wherein the support substrate is or includes at least one layer made of at least one of silicon, silicon carbide, sapphire, diamond, germanium, silicon-germanium, quartz, yttrium-stabilized zirconia, a group III-V compound or a group II-VI compounds.

13. The method of claim 12, wherein the group II-V compound is gallium nitride (GaN), gallium arsenide (AsGa) or indium phosphide (InP).

14. The method of claim 1, wherein the support substrate is made of a single-crystal or poly-crystal silicon, the useful layer is made of a single-crystal silicon, and the stiffening substrate is made of a single-crystal or poly-crystal silicon.

* * * * *